(12) United States Patent
Ware et al.

(10) Patent No.: US 10,388,355 B1
(45) Date of Patent: Aug. 20, 2019

(54) DUAL-DOMAIN MEMORY

(71) Applicant: Rambus Inc., Sunnyvale, CA (US)

(72) Inventors: Frederick A. Ware, Los Altos Hills, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/987,884

(22) Filed: May 23, 2018

Related U.S. Application Data

(60) Provisional application No. 62/626,678, filed on Feb. 5, 2018, provisional application No. 62/596,755, filed on Dec. 8, 2017.

(51) Int. Cl.
| G11C 11/402 | (2006.01) |
| G11C 5/06 | (2006.01) |
| G11C 11/409 | (2006.01) |

(52) U.S. Cl.
CPC .......... *G11C 11/4023* (2013.01); *G11C 5/063* (2013.01); *G11C 11/409* (2013.01)

(58) Field of Classification Search
None
See application file for complete search history.

(56) References Cited

U.S. PATENT DOCUMENTS

| 5,596,536 A | 1/1997 | Koh |
| 5,896,340 A | 4/1999 | Wong et al. |
| 6,084,804 A | 7/2000 | McPartland |
| 6,101,138 A | 8/2000 | Shiah et al. |
| 6,480,424 B1 | 11/2002 | Issa |
| 6,628,536 B2 | 9/2003 | Tomotani |
| 6,704,241 B1 | 3/2004 | Ha |
| 6,937,532 B2 | 8/2005 | Hatanaka et al. |
| 7,046,550 B1 | 5/2006 | Reohr et al. |
| 7,079,427 B2 | 7/2006 | Huang |
| 7,142,456 B2 | 11/2006 | Edelen et al. |
| 7,280,383 B2 | 10/2007 | Cho et al. |
| 7,440,354 B2 | 10/2008 | Liston et al. |
| 7,738,312 B2 * | 6/2010 | Shimano ................ G11C 5/063 365/207 |
| 7,983,108 B2 | 7/2011 | Manning |
| 8,116,149 B2 | 2/2012 | Chen et al. |
| 8,737,157 B2 | 5/2014 | Kim et al. |

(Continued)

OTHER PUBLICATIONS

Ram K. Krishnamurthy et al, "Exploring the Design Space of Mixed Swing QuadRail for Low-Power Digital Circuits", IEEE Transactions on Very Large Scale Integration (VLSI) Systems, Dec. 1997, pp. 388-400, vol. 5, No. 4.

*Primary Examiner* — James G Norman
(74) *Attorney, Agent, or Firm* — Charles Shemwell

(57) ABSTRACT

A memory cell within an integrated-circuit memory component receives a first control signal that transitions between supply voltage levels of a first voltage domain and a second control signal that transitions between supply voltage levels of a second voltage domain different from the first voltage domain. In response to the transitions of the first and second control signal, output-enable circuitry within the memory cell transitions an output-enable signal between one of the supply voltage levels of the first voltage domain and one of the supply voltage levels of the second voltage domain to enable output signal generation on an output signal line coupled to the memory cell.

21 Claims, 11 Drawing Sheets

(56) References Cited

U.S. PATENT DOCUMENTS

| | | |
|---|---|---|
| 9,030,906 B2 | 5/2015 | Rivers et al. |
| 9,147,473 B2 | 9/2015 | Kim et al. |
| 9,406,351 B2 | 8/2016 | Stansfield |
| 9,570,192 B1 | 2/2017 | Yoon et al. |

\* cited by examiner

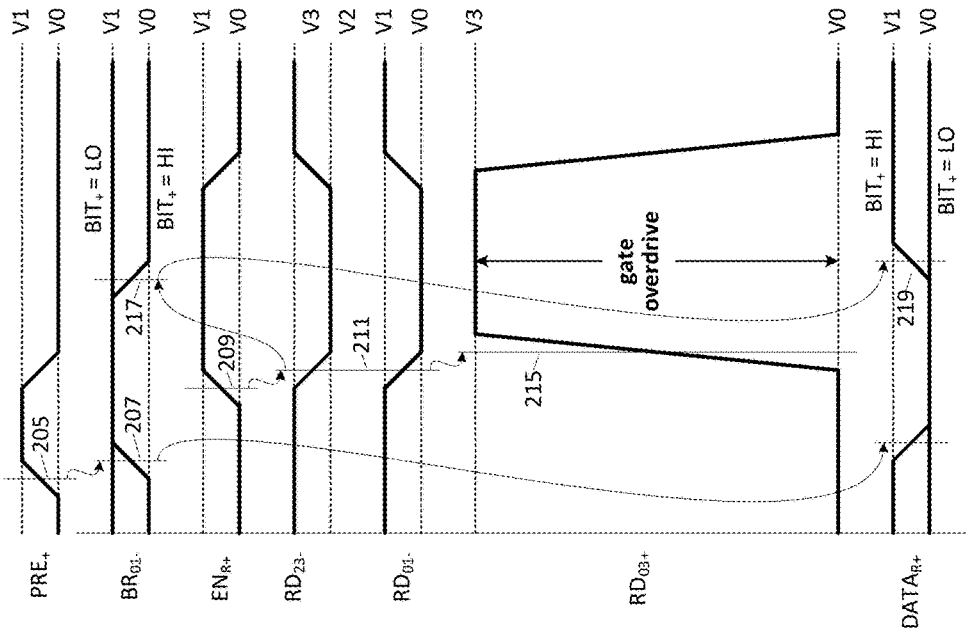
FIG. 3 Read Access
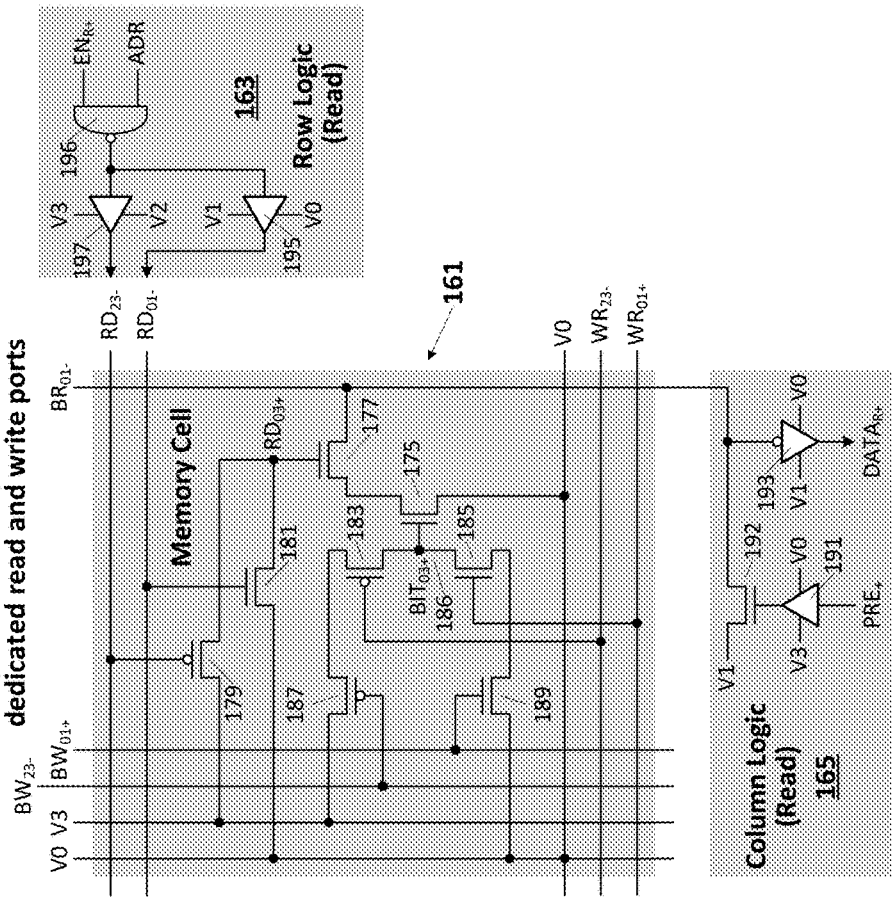
FIG. 2
Dynamic memory cell with dedicated read and write ports

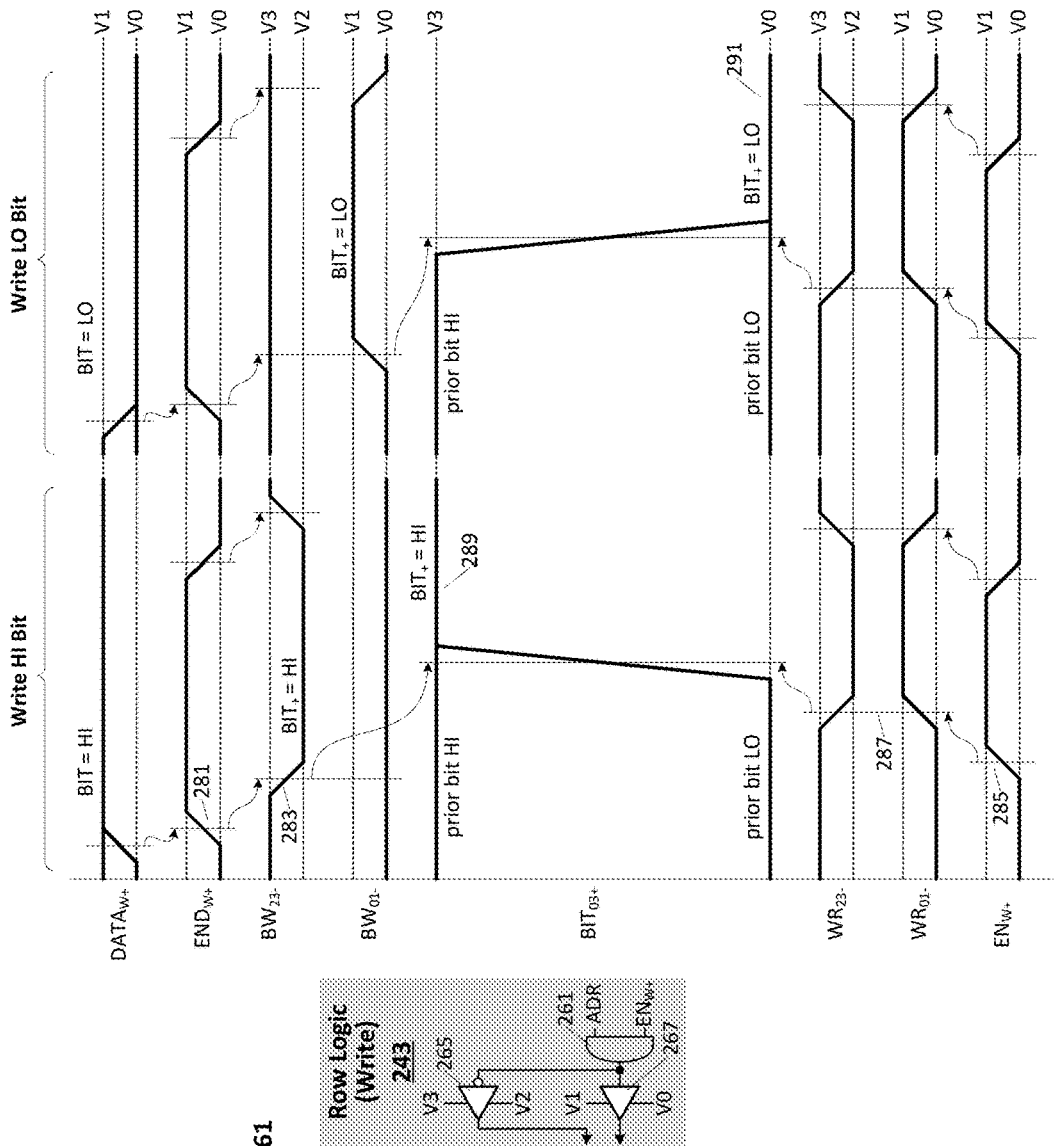
FIG. 5  Write Access
FIG. 4  Dynamic memory cell with dedicated read and write ports Quad-Port Memory Cell
2x Read Port/2x Write Port

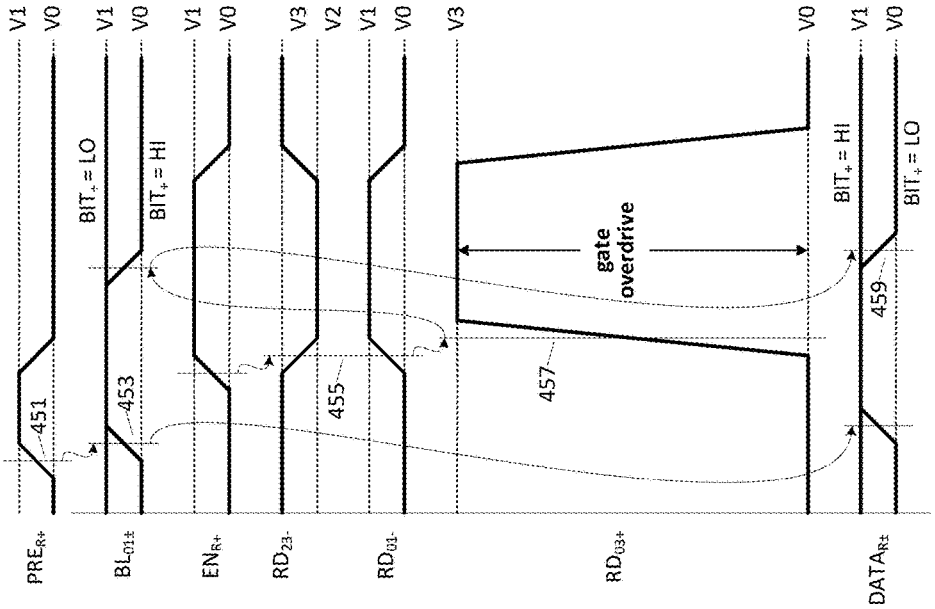
FIG. 8 Read Access
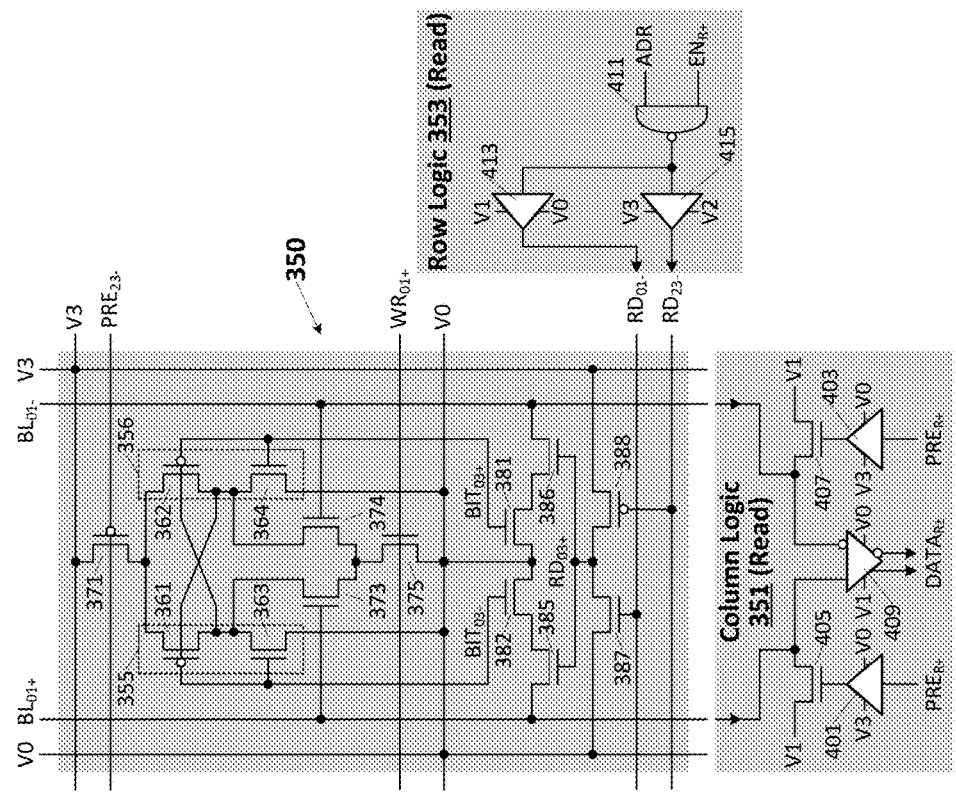
FIG. 7
Static memory cell with
dedicated read and write ports

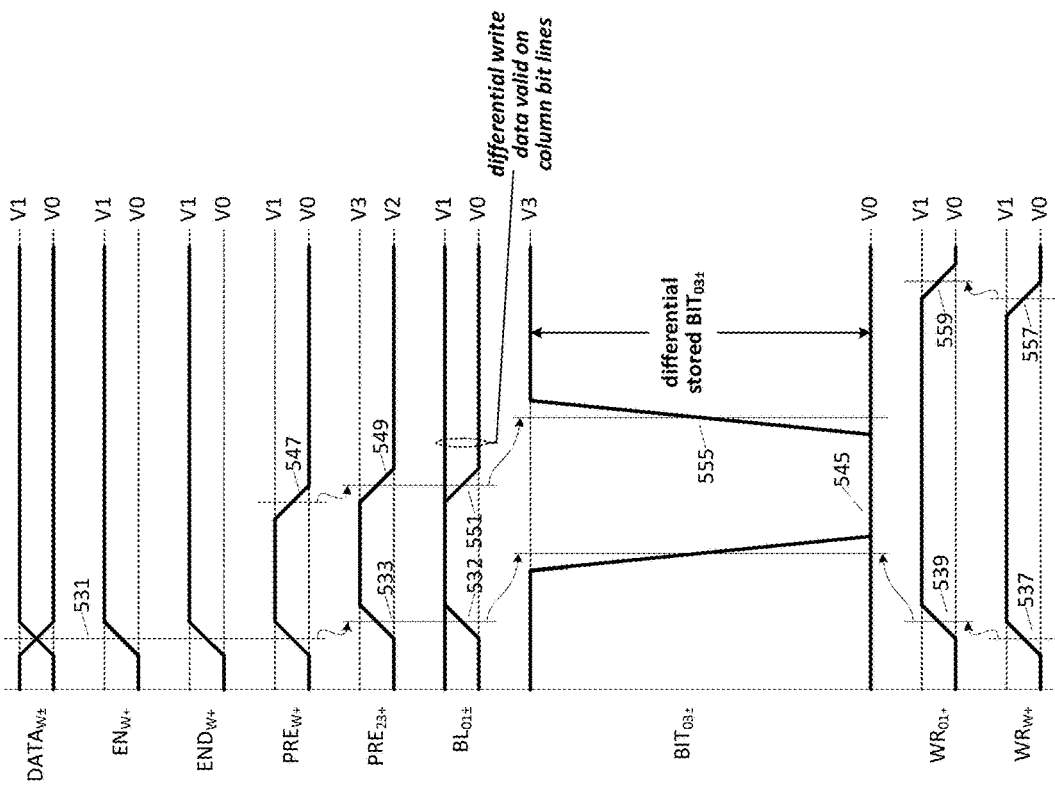
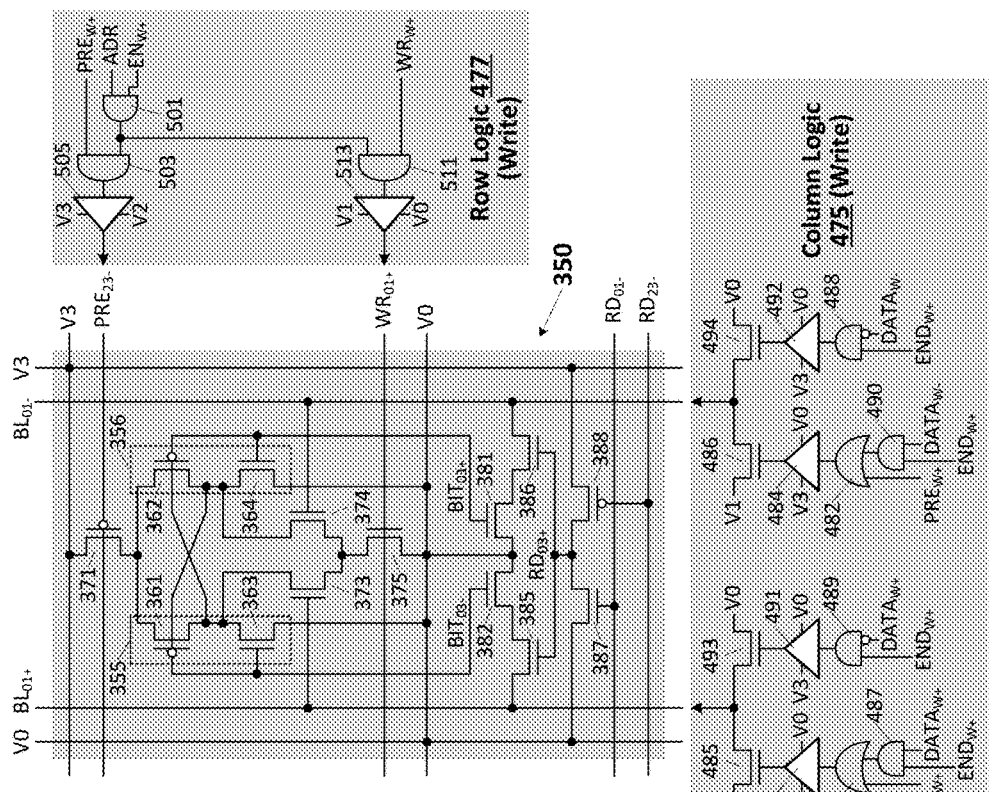

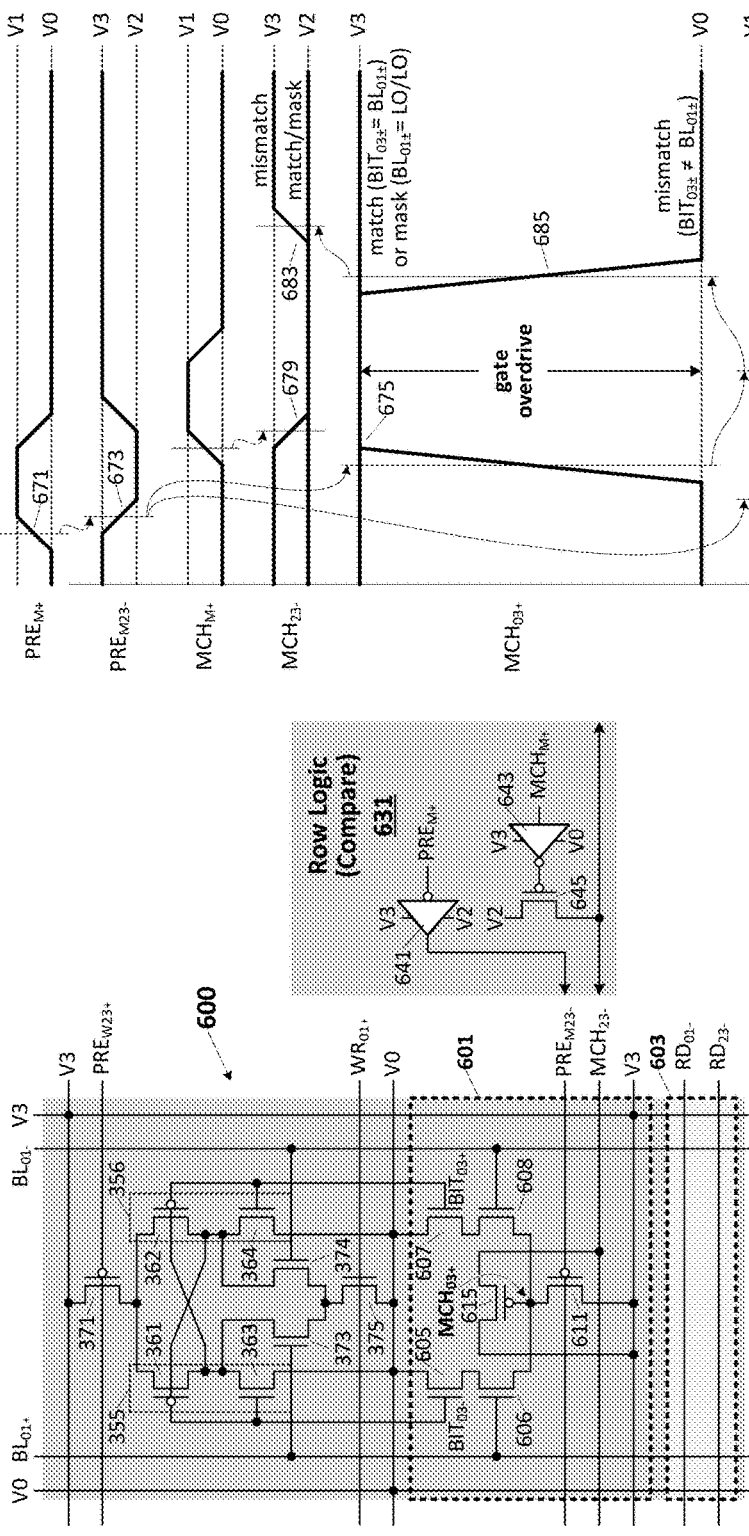

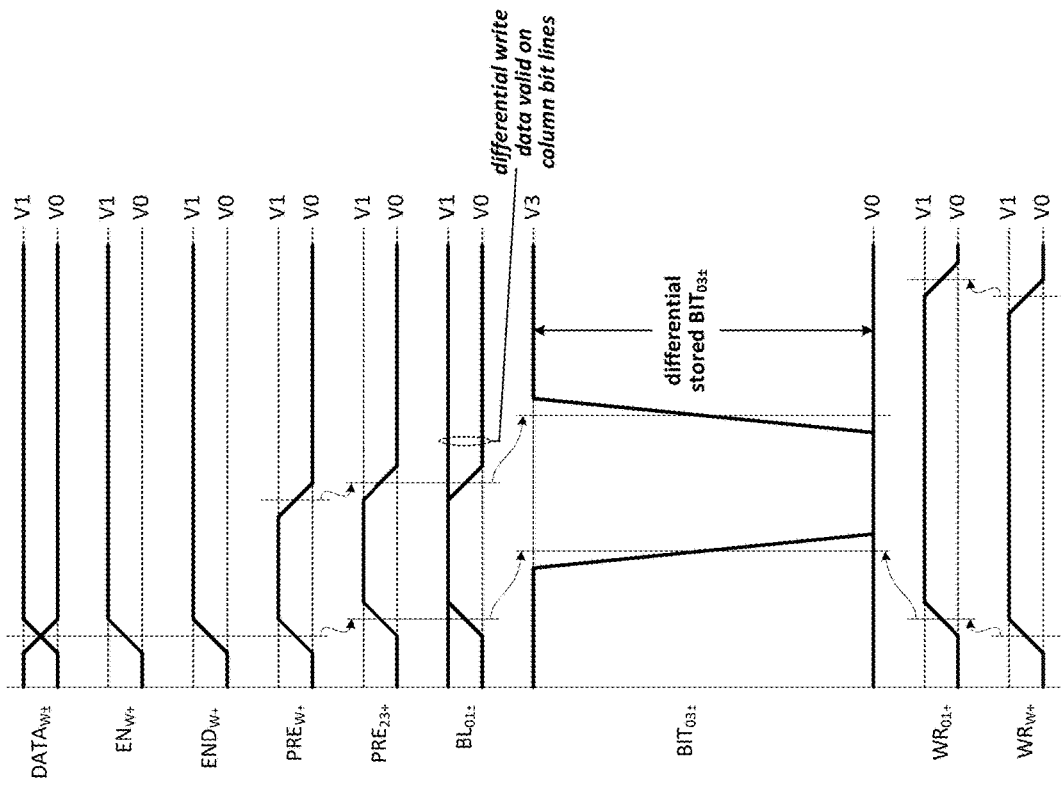
FIG. 14 Write Access
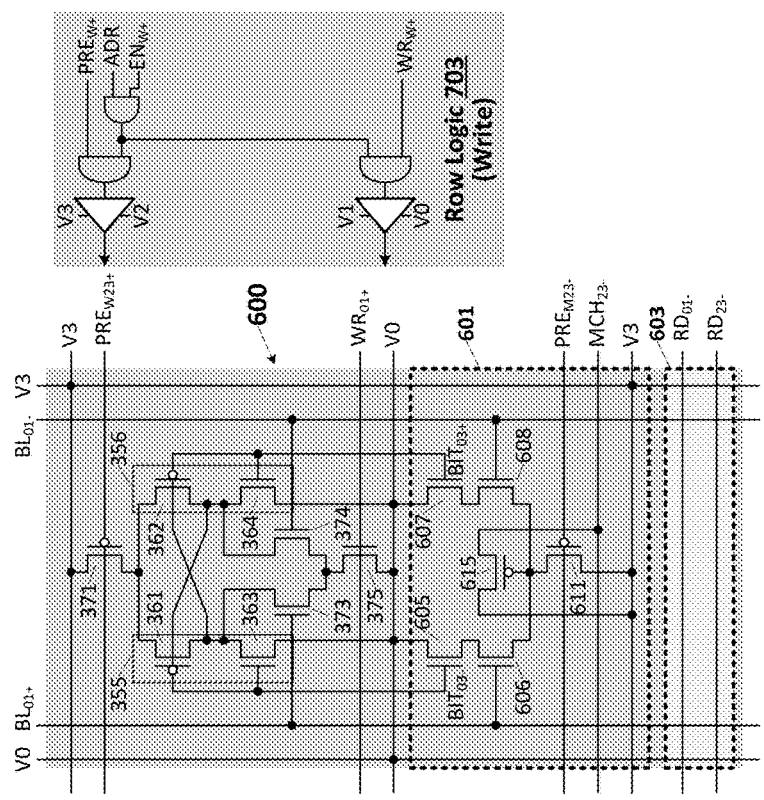
FIG. 13 Content-Addressable Memory Cell with shared read/write/match ports

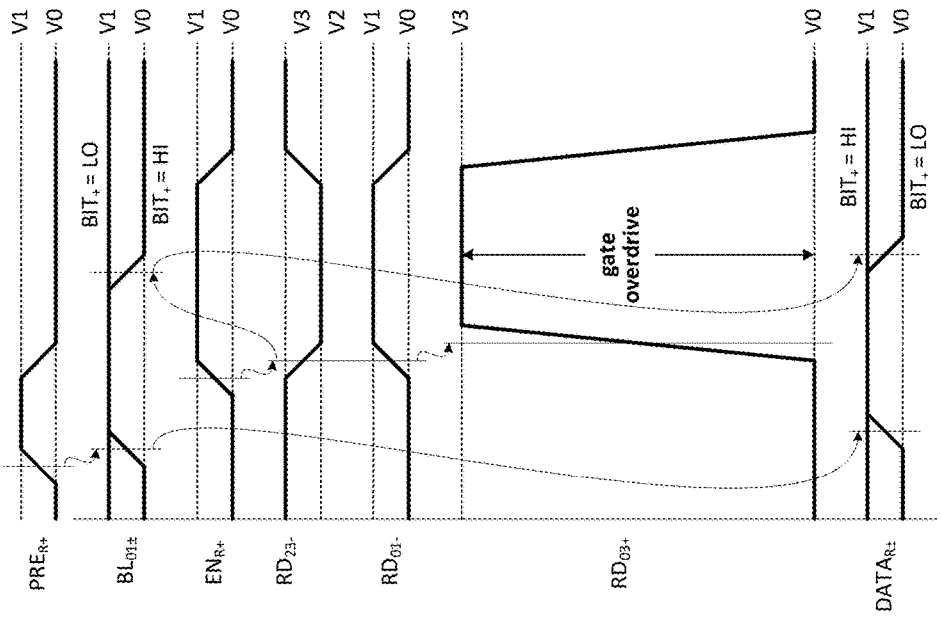
FIG. 16 Read Access
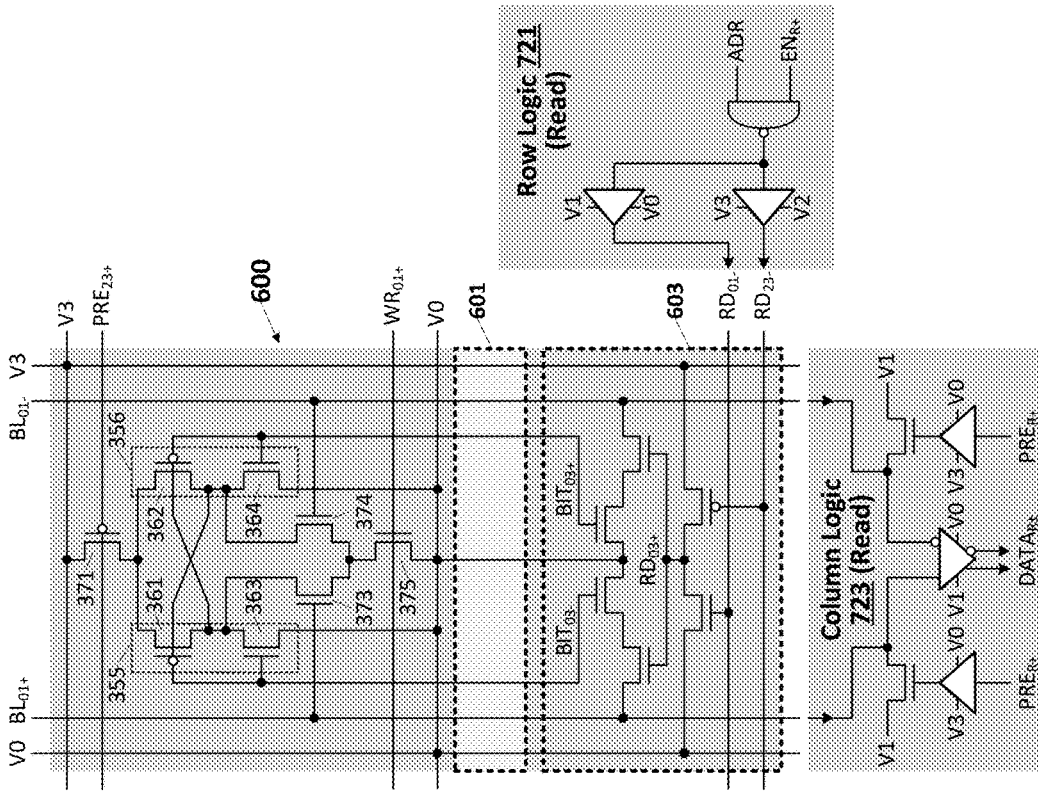
FIG. 15 Content-Addressable Memory Cell with shared read/write/match ports

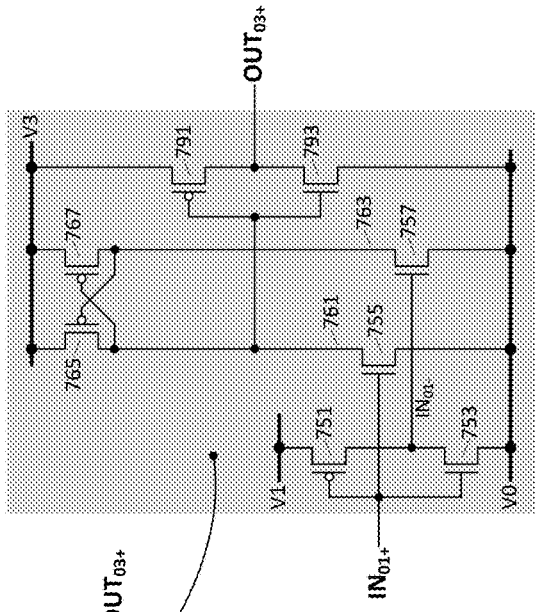
FIG. 19 Level-Shifting Large-Swing Line Driver
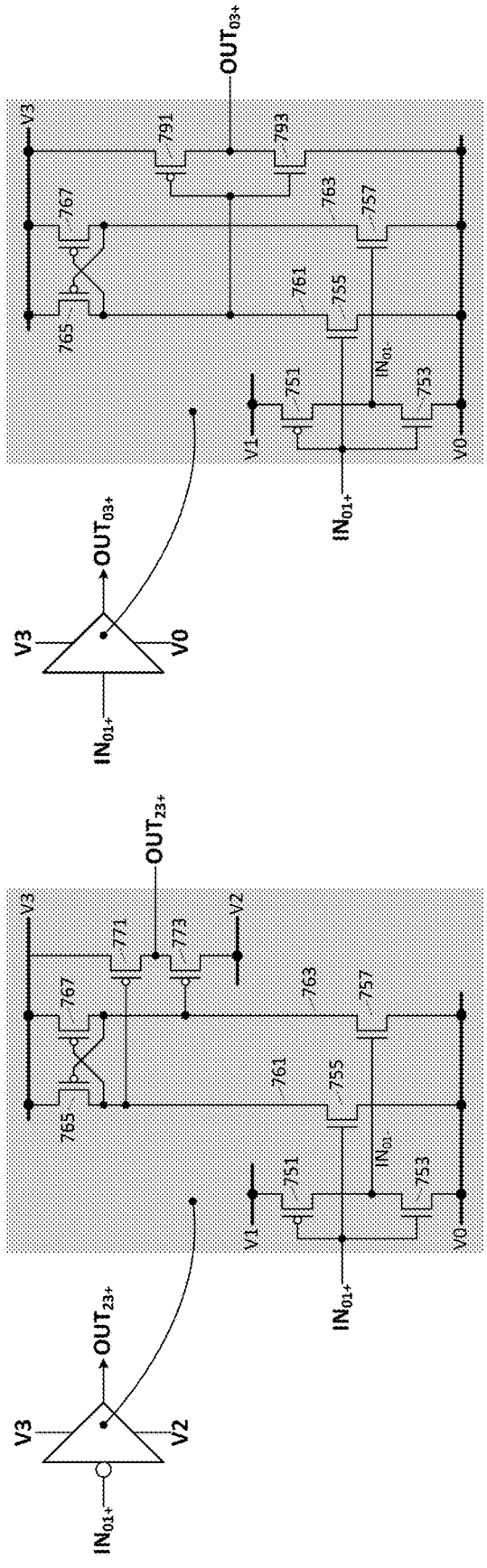
FIG. 17 Level-Shifting Small-Swing Line Driver
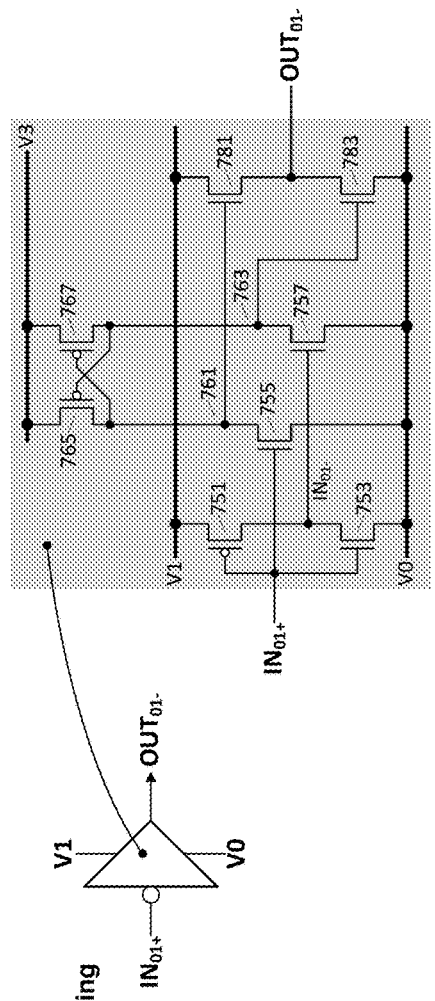
FIG. 18 Non-Shifting Small-Swing Line Driver

DUAL-DOMAIN MEMORY

CROSS REFERENCE TO RELATED APPLICATIONS

Technical Field

The present disclosure relates generally to data processing and more particularly to integrated-circuit memory.

DRAWINGS

The various embodiments disclosed herein are illustrated by way of example, and not by way of limitation, in the figures of the accompanying drawings and in which like reference numerals refer to similar elements and in which:

FIG. 2 illustrates an embodiment of a dual-domain dynamic memory cell that may populate the memory array of FIG. 1 together with row and column logic circuitry to enable a memory-read access within the dual-domain memory cell;

FIG. 3 illustrates exemplary signal timing for a memory read operation with respect to the dual-domain memory cell and row/column logic circuitry of FIG. 2;

FIG. 4 illustrates an embodiment of a dual-domain dynamic memory cell together with row and column logic circuitry to enable a memory-write access within the dual-domain memory cell;

FIG. 5 illustrates exemplary signal timing for a memory write operation with respect to the dual-domain memory cell and row/column logic circuitry of FIG. 4;

Figure 1:
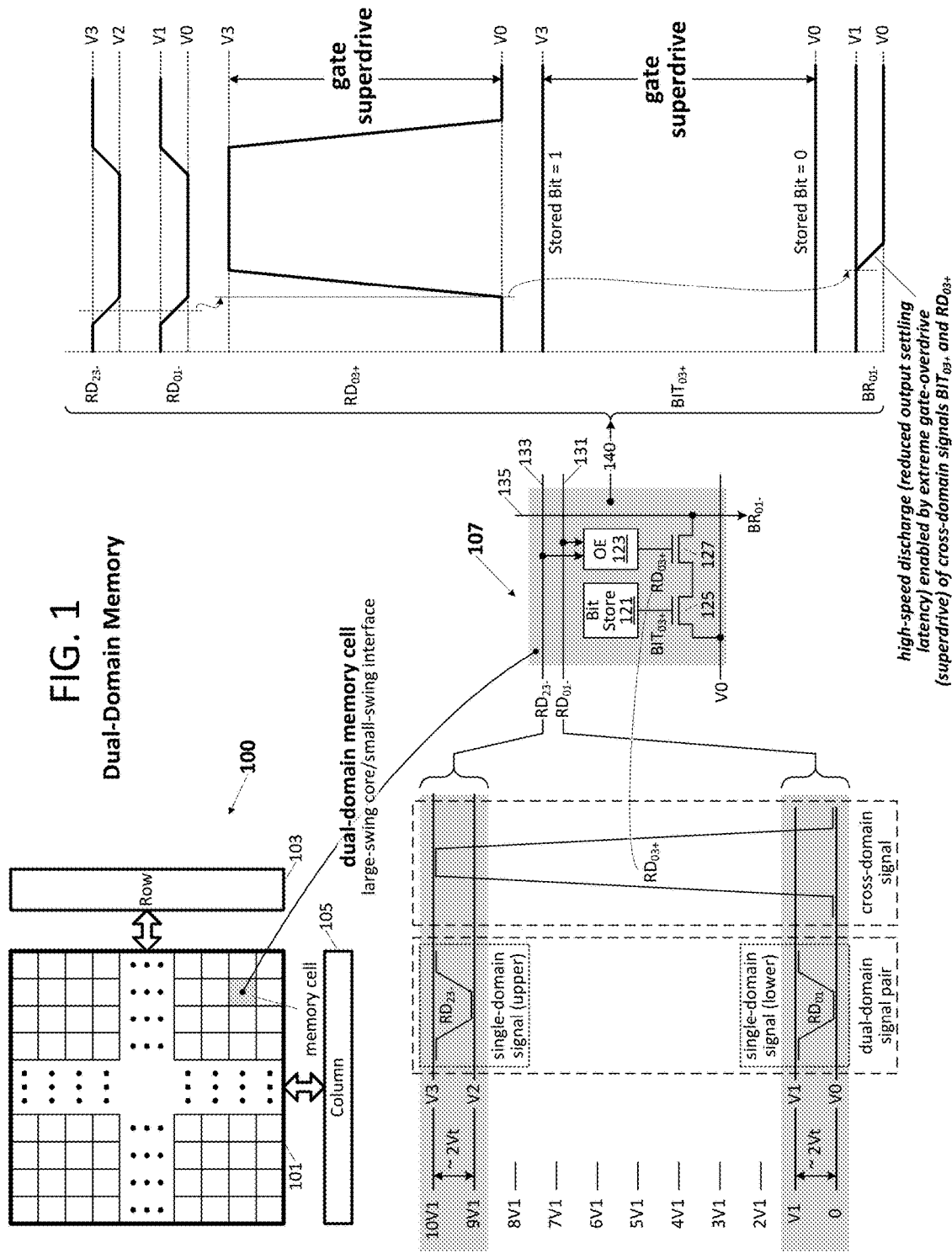
FIG. 1 illustrates an embodiment of a dual-domain integrated-circuit memory having a storage array and peripheral row and column circuitry.
Figure 6:
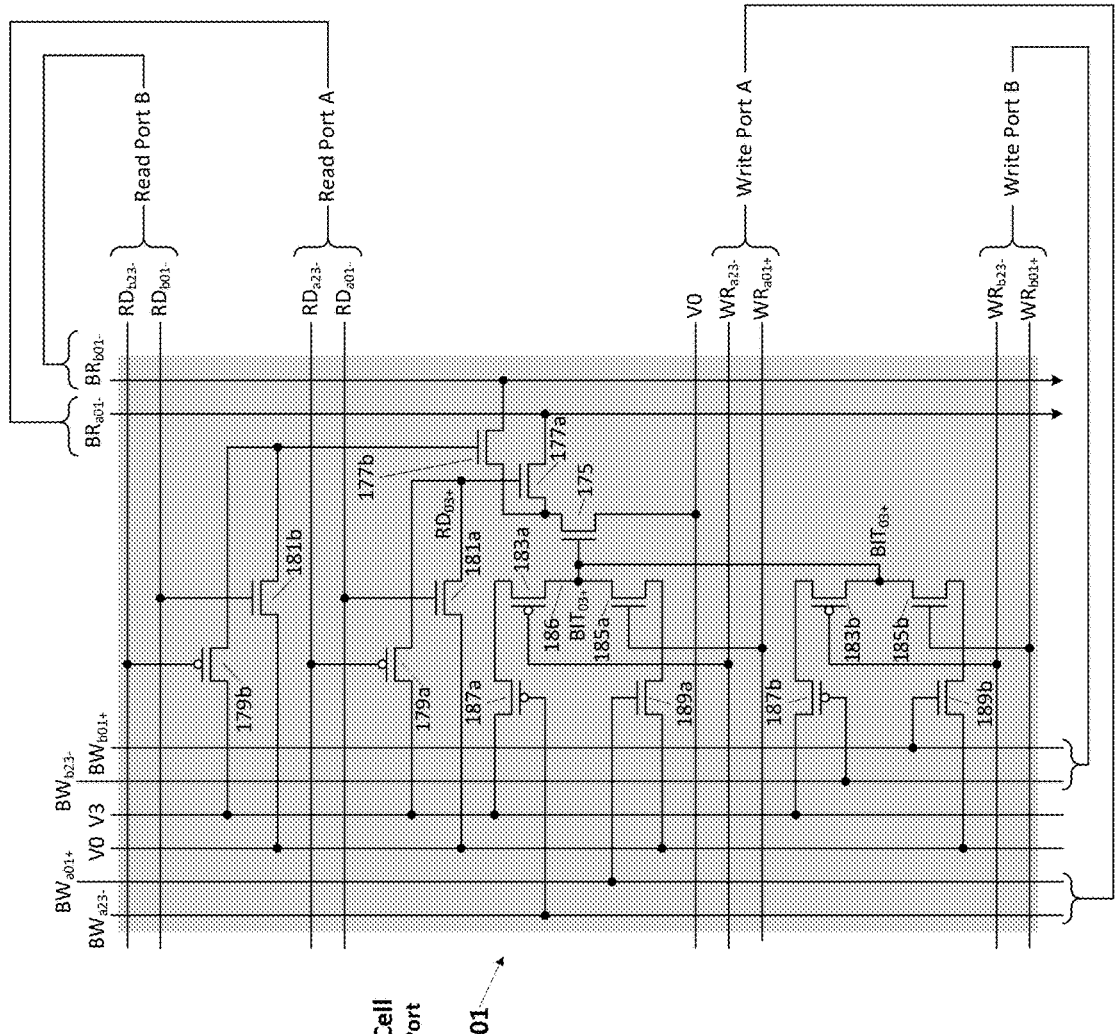
Figure 20:
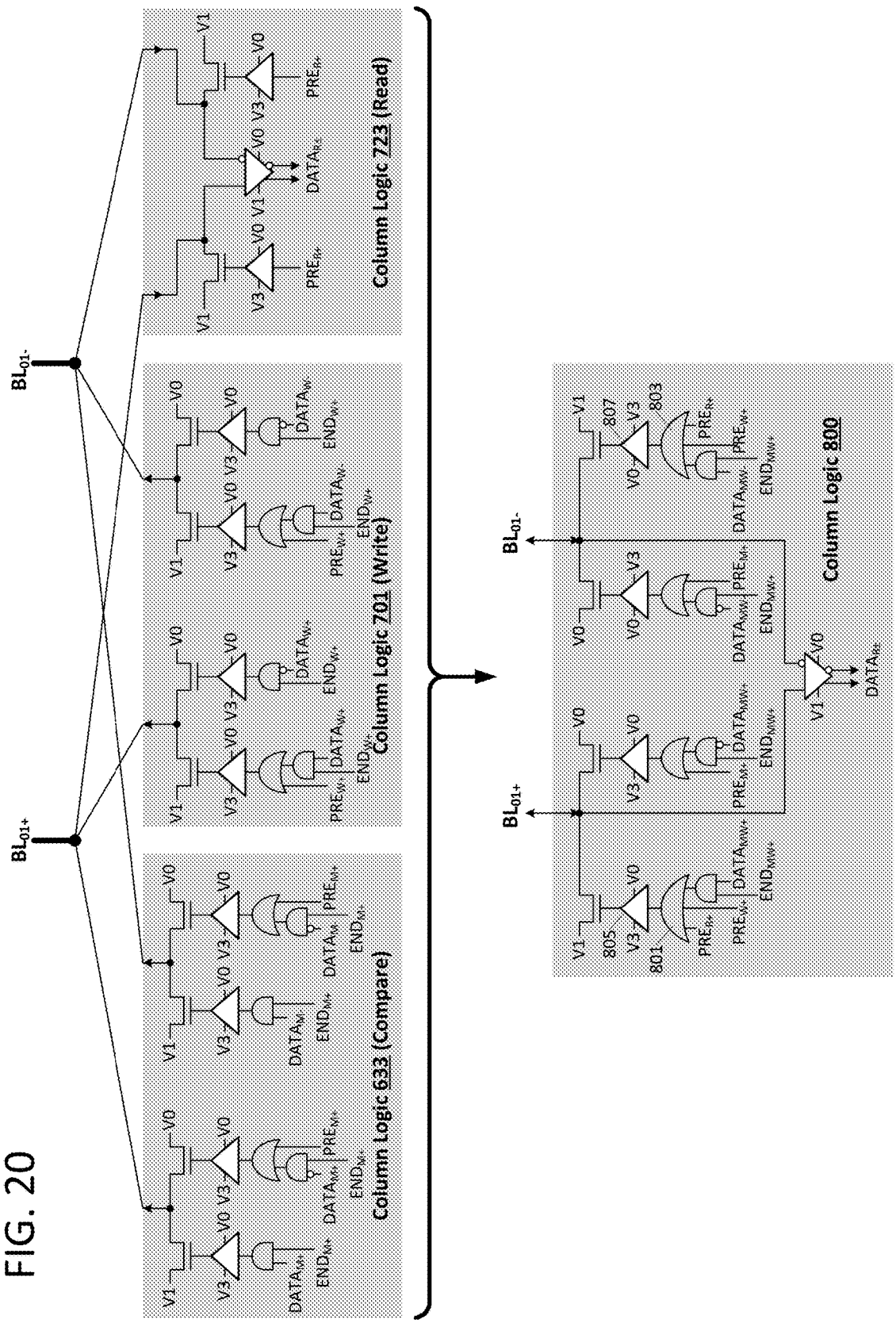

FIG. 6 an embodiment of a dual-domain memory cell having multiple read ports and multiple write ports;

FIG. 7 illustrates an embodiment of a dual-domain static memory cell that may populate the memory array of FIG. 1 together with row and column logic circuitry to enable a memory-read access within the dual-domain memory cell;

FIG. 8 illustrates exemplary signal timing for a memory read operation with respect to the dual-domain memory cell and row/column logic circuitry of FIG. 7;

FIG. 9 illustrates an embodiment of a dual-domain static memory cell together with row and column logic circuitry to enable a memory-write access within the dual-domain memory cell;

FIG. 10 illustrates exemplary signal timing for a memory write operation with respect to the dual-domain memory cell and row/column logic circuitry of FIG. 9;

FIG. 11 illustrates an embodiment of a dual-domain content-addressable memory (CAM) cell together with row and column logic circuitry to enable a memory-write access within the dual-domain CAM cell;

FIG. 12 illustrates exemplary signal timing for a data compare operation with respect to the dual-domain CAM cell and row/column logic circuitry of FIG. 9;

FIG. 13 illustrates an embodiment of a dual-domain CAM cell together with row and column logic circuitry to enable a memory-write access within the dual-domain CAM cell;

FIG. 14 illustrates exemplary signal timing for a memory write operation with respect to the dual-domain CAM cell and row/column logic circuitry of FIG. 13;

FIG. 15 illustrates an embodiment of a dual-domain CAM cell together with row and column logic circuitry to enable a memory-read access within the dual-domain CAM cell;

FIG. 16 illustrates exemplary signal timing for a memory read operation with respect to the dual-domain CAM cell and row/column logic circuitry of FIG. 15;

FIGS. 17-19 illustrate exemplary embodiments of intra-domain (small-swing) and cross-domain (large-swing) line drivers, all having circuitry to super-drive one or the other of two output-stage transistors according to the state of a small-swing input signal; and FIG. 20 illustrates an exemplary merging of column circuitry shown discretely in FIGS. 11, 13 and 15 to enable generation of control/data signals for compare, write and read operation with reduced component count.

DETAILED DESCRIPTION

Integrated-circuit memory arrays having small-swing control and data interfaces and large-swing data storage elements are disclosed in various embodiments herein. In a number of implementations, the large-swing data storage (e.g., bit storage) is coupled with large-swing output-enable circuitry to yield increased small-swing output drive current and correspondingly reduced data output latency (i.e., as output line capacitance may be more rapidly charged and/or discharged)—a particularly beneficial result in voltage-scaled cryogenic applications as the reduced output latency mitigates otherwise increased transistor gate delay. In a number of embodiments, small-swing control signals are delivered to the memory array in two different/stratified voltage domains, with some control signals swinging between supply rails of an upper voltage domain and others swinging between supply rails of a lower voltage domain. Each of the dual small-swing voltage domains (upper and lower) generally spans a voltage range approximately twice the threshold voltage of constituent transistors within the memory array and peripheral circuitry, while the voltage offset between the two domains is on the order of 5, 10, 20 (or more) times the transistor threshold voltage—an arrangement that enables generation of cell data storage and output-enable signals that transition between the two voltage domains and thus exhibit relatively large signal swings (i.e., as compared to incoming control signals and incoming/outgoing data signals). Such "cross-domain" signals may also be strategically generated within column and row logic circuits to enable generation of relatively high drive currents with respect to signal lines that traverse the memory array (i.e., relatively high-capacitance signal lines that otherwise exhibit relatively long settling delays and thus increase access latency). In yet other embodiments, the nature of the large-swing cell data storage may vary (e.g., capacitive storage or static storage), per-memory-cell input/output ports may be multiply instanced to enable operational concurrency (e.g., separate or shared read and write ports, multiple read and/or write ports, etc.) and optional compare/match circuitry may be provided to enable content-addressable memory (CAM) operation.

FIG. 1 illustrates an embodiment of a dual-domain integrated-circuit memory 100 having a storage array and peripheral row and column circuitry 103, 105. In a number of "storage memory" embodiments, row circuitry 103 performs a row-select operation, enabling data read or write access with respect to an addressed row of storage cells within array 101, while column circuitry 105 performs a data I/O function, receiving read data from the selected row of storage cells or driving write data to the selected row. In other content-addressable memory (CAM) embodiments, the row circuitry may additionally receive match signals from respective rows of storage cells (while the column circuitry drives constituent bits of a comparand value onto the column bit lines), each match signal indicating comparand match or mismatch with respect to the content of a given storage row.

Memory array 101 is populated by dual-domain memory cells arranged in rows and columns, a single example of which is depicted conceptually at 107. As shown, memory cell 107 includes a bit storage element 121, output-enable element 123 (which may optional in the case of a CAM embodiment) and output transistors 125 and 127. Row lines 131 and 133 convey read-enable signals $RD_{01-}$ and $RD_{23-}$, while bit line 135 conveys read data signal $BR_{01-}$. For ease of reference, signal lines are occasionally referred to herein by the names of the signals they conduct (distinguishing by context between signal line and conveyed signal) and the signal references themselves are subscripted to explicate the voltage domain to which the signal is constrained and the active signal level (low or high). In FIG. 1, for example, $RD_{01-}$ is an active low signal (indicated by '−') constrained to a lower voltage domain (i.e., "lower domain" signal that swings between the V1 and V0 voltage rails), while $RD_{23-}$ is an active low signal that swings between the V2 and V3 rails of an upper voltage domain. By contrast, the $BIT_{03+}$ and $RD_{03+}$ signals applied to the gates of output transistors 125 and 127, respectively, are active-high signals (indicated by '+') that swing between a lower domain voltage rail and an upper-domain voltage rail (V0 and V3, respectively, in this example)—large-swing signals referred to herein as cross-domain signals (or inter-domain signals or trans-domain signals) in view of their swing between respective rails of the upper and lower voltage domains. In the specific example shown, each of the upper and lower voltage domains span voltage ranges approximately twice the threshold voltage (Vt) of output transistors 125 and 127. Also, the V3 rail (higher voltage rail of the upper domain) is ~10× the V1 rail (higher voltage rail of the lower domain) so that the cross-domain signal swing from V0 to V3 or vice-versa is approximately 20× the threshold voltage of output transistors 125 and 127. The upper and or lower voltage domains may be implemented with voltage spans other than 2Vt in other embodiments, and the cross-domain signal swing may be more or less than 20Vt (e.g., 4Vt, 5Vt, 8Vt, 10Vt, 30Vt, 40Vt, etc.).

Referring now to read-out timing diagram 140 (not necessarily to scale), simultaneous active-low states of row signals RD23− and RD01− trigger assertion of a cross-domain read-enable signal $RD_{03+}$ that "super-drives" the gate of transistor 127 (i.e., gate-to-source voltage, $V_{GS}$, substantially more than twice the transistor threshold voltage, $V_t$) to enable, when $BIT_{03+}$ is also high, a substantially larger drain-to-source current flow through transistors 125 and 127 (i.e., discharging bitline BR01− to lower domain rail V0) than achievable by gate voltages constrained within either of the upper or lower voltage domains. In a CMOS (complementary metal-oxide-semiconductor) implementation of transistors 125 and 127, for example, the transistor output current $I_{DS}$ (drain-to-source current) for a gate-to-source voltage ($V_{GS}$) above the transistor threshold voltage (Vt) is first-order proportional to the gate overdrive voltage (i.e., $V_{GS}-V_t$), so that substantially higher output current corresponding approximately to the ratio of the cross-domain potential |V3−V0| to the intradomain potential |V1−V0| (or |V3−V2|) is produced by the $RD_{03+}$ transition from V0 to V3 relative to that achieved if the same signal transitioned merely from V0 to V1. Accordingly, dual-domain memory cell may transition relatively high-capacitance bit line $BR_{01-}$ between intra-domain signal levels (discharge from V1 to V0 in this example) much more rapidly than possible with a conventional single-domain memory cell with equivalently sized transistors.

FIG. 2 illustrates an embodiment of a CMOS dynamic memory cell 163 that may populate the memory array of FIG. 1 (i.e., implementing memory cells 107) together with row and column logic circuitry 163, 165 to enable a memory-read access within the memory cell. In the implementation shown, memory cell 161 includes data-switched transistor 175 and bitline-interconnect transistor 177 having gate terminals coupled to receive cross-domain data-bit and access-enable signals, $BIT_{03+}$ and $RD_{03+}$, generally as discussed with respect to output transistors 125 and 127 of FIG. 1. PMOS and NMOS transistors 179 and 181 are coupled source-to-drain (or vice-versa) between the $RD_{03+}$ signal node and V3 and V0 supply rails, respectively, and receive the $RD_{23-}$ and $RD_{01-}$ read-enable signals at their gates. Except during a memory access directed to memory cell 161 (and cells in the same row of the memory array), read-enable signals $RD_{01-}$ and $RD_{23-}$ are held high (deasserted) at V1 and V3, respectively, meaning that transistor 181 is switched on (and transistor 179 switched off) to couple signal node RD03+ (i.e., gate of bitline-interconnect transistor 177) to V0 and thus prevent memory cell 161 from affecting bit line $BR_{01-}$. The bit storage element itself is implemented by charge-isolation transistors 183 and 185, with the state of the stored bit ($BIT_{03+}$) corresponding to the presence or absence of trapped charge at capacitive node 186 (i.e., capacitance formed by the gate of data-switched transistor 175 as well as isolated drain capacitances of switched off transistors 183 and 185. Memory write to cell 161 is explained in greater detail below, but is generally effected by storing/recording a relatively positive or relatively negative charge level as the $BIT_{03+}$ data state (logic '1' or logic '0', respectively, in this example) by switching on transistors 183 and 185 and selectively turning on either V3-rail-interconnect transistor 187 or V0-rail-interconnect transistor 189, respectively. After bit storage node $BIT_{03+}$ has been charged to V3 or discharged to V0, transistors 187 and 189 are switched off to isolate the charge level and thus retain the stored data bit.

Still referring to FIG. 2 and also to the read-access timing diagram in FIG. 3, a read access is commenced by assertion of a logic-level (i.e., small-swing or intra-domain) bitline precharge signal ($PRE_+$) at the input of cross-domain signal driver 191 within column logic 165 as shown at 205. Signal driver 191 responds by super-driving the gate of bitline precharge transistor 192 (i.e., transitioning the gate potential of transistor 192 from V0 to V3) to effect a high-current precharge of bitline $BR_{01-}$ to potential V1 at 207—either charging $BR_{01-}$ to V1 or maintaining BR01− at V1 depending on the residual state of the bitline following a prior read-out (i.e., according to the HI/LO state of the bit read-out in a prior read access). After bitline BR01− is precharged to V1, logic-level read-enable signal $EN_{R+}$ is asserted (209) at an input of NAND gate 196 within row logic 163 so that, upon address decode that resolves to the row containing memory cell 161 (i.e., logic-level signal ADR asserted), NAND gate 196 drives a low signal to lower-domain and upper-domain line drivers 195 and 197, respectively. Line drivers 195 and 197, in turn, drive respective read-enable lines $RD_{01-}$ and $RD_{23-}$ to active-low assertion levels within the lower and upper voltage domains, respectively—driving $RD_{01-}$ to V0 and $RD_{23-}$ to V2 as shown at 211. The dual-domain read-enable signal assertions (one read-enable signal in each voltage domain) switch off NMOS transistor 181 and switch on PMOS transistor 179, decoupling cross-domain signal node $RD_{03+}$ from the V0 rail and coupling that node instead to the V3 rail, thereby transitioning $RD_{03+}$ from V0 to V3 as shown at 215 to super-drive the gate of bitline-interconnect transistor 177. Shortly after $RD_{03+}$ goes high to switch on transistor 177 (i.e., hard turn-on per the super-driven gate), bitline (data read-out line) $BR_{01-}$ is either discharged or left in the V1-precharged state according to the stored bit state, $BIT_{03+}$ (217). That is, if $BIT_{03+}$ is high (i.e., at or near the V3 potential), super-driven transistors 175 and 177 form a high-current conduction path to discharge $BR_{01-}$ (i.e., the BIT+=HI condition shown with respect to $BR_{01-}$ in FIG. 3), and if $BIT_{03+}$ is low, data-switched transistor 175 remains off so that no bitline discharge occurs (the BIT+=LO condition shown with respect to $BR_{01-}$). Because the precharged state of $BR_{01-}$ is pre-established, the discharge rate of $BR_{01-}$ in response to a high (V3) state of $BIT_{03+}$ defines the worst-case readout latency—a $BR_{01-}$ settling delay inversely proportional to the source-to-drain current through transistors 175 and 177 and thus significantly abbreviated (i.e., delay reduction first-order proportional to the ratio of V3 to V1) by the super-driven gates of those transistors. As shown at 219, inverting signal driver 193 drives either a logic high or logic low data output ($DATA_{R+}$) a relatively short while after $RD_{03+}$ goes high and the data output state resolves on $BR_{01-}$.

FIGS. 4 and 5 illustrate row and column logic circuitry (243, 245) and operational timing for a memory write access within dynamic memory cell 161 (the same memory cell shown in FIG. 2). In the depicted example, a data write to capacitive storage node $BIT_{03+}$ (186) is initiated by raising a write-data enable signal ($END_{W+}$) at inputs of NAND and AND gates 251 and 253 within column logic 245 (shown at 281 in FIG. 5), which, depending on the state of the data bit to be written/stored ($DATA_{W+}$), will drive dual-domain bit-write column lines $BW_{23-}$ and $BW_{01-}$ both low ($DATA_{W+}$ high) or both high ($DATA_{W+}$ low) within their respective upper and lower voltage domains and thus turn on one of rail-interconnect transistors 187 and 189 while keeping the other off. More specifically, when writing a high data bit ($DATA_{W+}$=HI), assertion of $END_{W+}$ produces a high-to-low transition at the output of NAND gate 251 and, as that output feeds upper-domain line driver 255, a V3 to V2 transition on bit-write line $BW_{23-}$ (283) that switches on high-rail interconnect transistor 187. The output of AND gate 253 remains low during that same interval so that the output of lower-domain line driver 257 remains at V0, driving $BW_{01+}$ low (deasserted) to maintain low-rail interconnect transistor 189 in a non-conducting state. Shortly after establishing this setup condition, a row write-enable signal $EN_{W+}$ is raised within row logic 243 as shown at 285 (i.e., at the input of AND gate 261, which also receives one or more signals ADR that is/are raised when an address is decoded to the subject row) to drive dual-domain write-access lines $WR_{01+}$ and $WR_{23-}$ to asserted signal levels, driving $WR_{23-}$ low (to V2) via inverting upper-domain line driver 265 and driving $WR_{01+}$ high (to V1) via lower-domain line driver 267; operations shown in FIG. 5 at 287. The active write-access lines switch on storage-node access transistors 183 and 185 and thereby couple cross-domain bit-storage node 186 ($BIT_{03+}$) to either the V3 or V0 supply rail according to which of rail-interconnect transistors 187 and 189 has been switched on by the column write logic 245—the V3 rail in this write-high example as shown at 289. After an interval sufficient to transition the bit storage node from V0 to V3 (the worst-case from a write latency standpoint as compared to where the bit storage node was already at V3 due to prior stored bit=HI), the row and column write-enable signals $EN_{W+}$ and $END_{W+}$ are deasserted, switching off rail-interconnect transistors 187/189 and storage-node access transistors 183/185 to isolate the V3 storage within capacitive node $BIT_{03+}$.

Still referring to FIGS. 4 and 5, a write LO ($DATAW+$ is low) access proceeds in the same manner as the write HI access, but with the low state of $DATA_{W+}$ yielding high output from NAND gate 251 and a high output from AND gate 253 (i.e., due to the inverting input of gate 253) and thus driving V1 and V3 potentials on bit-write lines $BW_{01+}$ and $BW_{23-}$, respectively, to switch on rail-interconnect transistor 189 and switch off rail-interconnect transistor 187. Accordingly, when storage-node access transistors 183 and 185 are switched on by row logic 163, storage node $BIT_{03+}$ is coupled to the V0 rail and thus discharged (if the prior stored bit was HI) to record a low (LO) bit state as shown at 291.

Reflecting on FIGS. 2 and 4, it should be appreciated that the row and column logic within a given memory component will include both the write access and read access circuits (potentially leveraging one or more components for dual purposes). Also, the separate read and write ports, formed respectively by read-out bitline $BR_{01-}$ and write bitlines $BW_{23-}$/$BW_{01+}$ and the transistors that they switch, may use a shared (time-multiplexed) bitline or set of bitlines and/or may each or both be replicated to provide multiple write ports and/or read ports. FIG. 6, for example, illustrates a memory cell embodiment 301 having two read ports, 'A' and 'B', and two write ports, also 'A' and 'B'. Read port A corresponds to the read port (output-enable circuitry) discussed in reference to FIG. 2 (i.e., implemented by transistors 177a, 179a and 181a which correspond to transistors 177, 179 and 181 in FIG. 2), while read port B is identically implemented by an added output-enable transistor 177b (coupled to drive an additional column read-out line $BR_{b01-}$) and an added pair of rail-interconnect transistors 179b and 181b. The additional rail-interconnect transistors 179a and 179b have gates respectively coupled to port B read-access lines $RD_{b01-}$ and $RD_{b23-}$ and are coupled source-to-drain between the gate terminal of output-enable transistor 177b and respective V3 and V0 voltage rails. Read access via read port A is executed as discussed in reference to FIG. 3 above, while read access via read port B is carried out in the same manner as port A, but with control established through the port-B read-enable lines and data output conveyed via the port B read data line.

Write port A corresponds to the write port discussed in reference to FIG. 4 (i.e., implemented by transistors 183a, 185a, 187a and 189a which correspond to transistors 183, 185, 187 and 189 in FIG. 4), while write port B is identically implemented by transistors 183b, 185b, 187b and 189b. Gate terminals of rail-interconnect transistors 187b and 189b are coupled respectively to dual-domain port B write data lines $BW_{b23-}$ and $BW_{b01+}$, while source terminals of those transistors are coupled to voltage rails V3 and V0, respectively, and drain terminals of those transistors are coupled to respective source terminals of access transistors 183b and 185b. Gate terminals of transistors 183b and 185b are coupled to port-B write-enable lines (dual-domain signal lines) $WR_{b23-}$ and $WR_{b01+}$, while drain terminals of those transistors are coupled together at cross-domain bit storage node 186 ($BIT_{03+}$). Memory write access via port A occurs as discussed above in reference to FIG. 5, and port-B write access is carried out in the same manner, but with data supplied on the port-B write data lines ($BW_{b23-}$ and $BW_{b01+}$) and control established through the port-B write-enable lines ($WR_{b23-}$ and $WR_{b01+}$).

Referring to FIGS. 2, 4 and 6, periodic refresh operations may be carried out to maintain the charge on the capacitive node $BIT_{03}$ (186) of the subject memory cell (161 or 301). In cryogenic applications, the minimum time between refresh operations (refresh interval) is relatively long due to the extremely low leakage currents through access devices 183 and 185 (or 183a, 183b, 185a and 185b) at cryogenic operating temperature. Refresh operations may also be required due to interference or "disturb" (noise coupled to the $BIT_{03}$ storage node) resulting from accesses to memory cells in adjacent rows and columns. This interference is also relatively small at cryogenic operating temperature (i.e., compared to conventional memories operated in higher temperature environments) because the stored signal has a large voltage swing and the surrounding bit and word lines have smaller swings. Thus, refresh operations to compensate for leakage and/or disturb contribute less overhead (i.e., consume a smaller fraction of total time available for memory read and write access) relative to dynamic memory circuits operating at room temperature (e.g., embedded DRAM used for cache memory in processor cores).

Memory cell refresh may be effected, for example, by performing a memory read operation to yield data read-out on column line $BR_{01-}$ and then looping that data signal (e.g., in the form of $DATA_{R+}$ as shown in FIG. 2) back to the write data input (e.g., $DATA_{W+}$ as shown in FIG. 4) as part of a data write operation—writing back the read-out data value. In one embodiment, the refresh operation is carried out as a single memory access transaction (i.e., single address decode) either in response to an express refresh instruction received within the memory component (e.g., memory component 100 of FIG. 1) or as part of an internally-triggered maintenance operation. In either case, the refresh operation may be executed simultaneously with respect to an entire row of memory cells within the memory array or portion thereof, with the row address (and any column address) supplied by a remote component or from a counter within the memory component itself (i.e., an internal refresh counter that is incremented at each refresh operation).

FIG. 7 illustrates an alternative dual-domain memory cell embodiment 350 that may implement individual memory cells 107 within the memory array of FIG. 1. In contrast to the dynamic (capacitive) bit storage within the memory cells of FIGS. 2, 3 and 6, differential data storage nodes $BIT_{03-}$ and $BIT_{03+}$ of memory cell 350 are implemented by output nodes of back-to-back-coupled CMOS inverters 355 and 356 that effect static data storage (i.e., data held indefinitely with no refresh required). More specifically, the output node of inverter 355 (interconnected drain terminals of constituent PMOS and NMOS transistors 361, 363) is coupled to the input node of inverter 356 (i.e., to gate terminals of constituent PMOS and NMOS transistors 362, 364), with the output node of inverter 356 (interconnected drains of transistors 362, 364) is likewise coupled to the input node of inverter 355 (gate terminals of transistors 361, 363) to form a bi-stable latch. Each of inverters 355 and 356 is coupled between upper-domain supply rail V3 (i.e., sources of PMOS transistors 361 and 362 coupled to V3 via PMOS transistor 371 which, except during data-write, is switched on to power the inverters) and lower-domain supply rail V0, and the output nodes (and input nodes) of the two inverters are coupled to write port transistors 373, 374 and 375. The differential stored-data nodes $BIT_{03+}$ and $BIT_{03-}$ (which are also the output nodes of inverters 355, 356) are coupled to gates of read-port-transistors 381 and 382, respectively, with transistors 385, 386, 387 and 388 provided to switchably coupled the read-port outputs (drain terminals of transistors 381 and 382) to a differential bitline pair $BL_{01+}$, $BL_{01-}$.

Referring now to FIGS. 7 and 8, a memory read operation proceeds generally as discussed in reference to FIGS. 2 and 3, with bitline precharge signal $PRE_{R+}$ being asserted (451, FIG. 8) at the input of cross-domain drivers 401 and 405 within column logic 351 to super-drive the gates of bitline precharge transistors 405 and 407, respectively, and thereby effect a high-current (rapid) precharge of bitlines $BL_{01+}$ and $BL_{01-}$ to potential V1 (i.e., with both lines of the otherwise differential bitline pair being driven to V1 as shown at 453 in FIG. 8). After bitlines $BL_{01-}$ and $BL_{01+}$ have been precharged to V1, logic-level read-enable signal $EN_{R+}$ is asserted at the input of NAND gate 411 (within row logic 353) so that, upon address decode that resolves to the subject memory cell and memory cell row (i.e., asserting ADR), NAND gate 411 drives a low signal to lower-domain and upper-domain line drivers 413 and 415, respectively. The dual-domain line drivers, in turn, drive read-enable lines $RD_{01-}$ and $RD_{23-}$ to active-low assertion levels (i.e., driving $RD_{01-}$ to V0 and $RD_{23-}$ to V2 as shown at 455 in FIG. 8) to switch off transistor 387 and switch on-transistor 388, thereby decoupling cross-domain signal node $RD_{03+}$ from the V0 rail and coupling that node instead to the V3 rail. By this operation, $RD_{03+}$ transitions from V0 to V3 (i.e., as shown at 457 in FIG. 8) to super-drive the gates of transistors 385 and 387 and thereby couple the read-port outputs (drain terminals of transistors 381 and 382) to precharged bitlines BL01− and BL01+, respectively. Accordingly, shortly after $RD_{03+}$ goes high at 457, the differential bitlines are driven to opposite states—one remaining at V1 and the other discharged to V0 via the switched on one of transistors 381/382—in accordance with the state of differential data storage $BIT_{03+}/BIT_{03-}$. As in the dynamic-memory cell readout discussed above, the bitline discharge rate (which directly impacts readout latency) is directly proportional to the source-to-drain current through discharge-path transistors 382/385 or 381/386 and thus made dramatically shorter by the super-driven gates of the subject transistor pair. As shown at 459, inverting signal driver 409 within column logic 351 drives either a logic high or logic low differential data output ($DATA_{R\pm}$) a relatively short while after $RD_{03+}$ goes high.

FIGS. 9 and 10 illustrate exemplary data-write circuitry within column logic 475 and row logic 477 and operational timing for a memory write access within static memory cell 350 (the same memory cell shown in FIG. 7). A data write to static storage node $BIT_{03\pm}$ is initiated by raising a write-precharge signal $PRE_{W+}$ within column logic 475, causing the outputs of OR gates 481 and 482 to go high at respective inputs of cross-domain line drivers 483 and 484, thereby precharging otherwise differential bitlines $BL_{01+}$ and $BL_{01-}$ to V1 via transistors 485 and 486. This operation is shown at 531 and 532 in FIG. 10. In the embodiment shown, $PRE_{W+}$ is also logically ANDed with write-enable signal $EN_{W+}$ and address-resolution signal ADR within row logic 477 (i.e., in gates 501 and 503) to raise precharge signal $PRE_{23-}$ to V3 via upper-domain line driver 505 (as shown at 531 and 533 in FIG. 10) and thereby switch off transistor 371 to decouple inverter pair 355/356 from upper-domain supply rail V3. The ADR and write-enable signal are likewise ANDed with a second write-enable signal $WR_{W+}$ (i.e., in gates 501 and 511) to raise write-access signal $WR_{01+}$ via lower-domain line-driver 513 (as shown at 537 and 539 in FIG. 10) and thereby switch on write-port transistor 375. The precharged (V1) state of bitlines $BL_{01+}$ and $BL_{01-}$ switches on transistors 373 and 374 to equalize otherwise differential data storage nodes $BIT_{03+}$ and $BIT_{03-}$ at V0 (as shown at 545 in FIG. 8) in preparation for data storage. Shortly after the data storage nodes are equalized at V0, write-precharge signal $PRE_{W+}$ is lowered at 547, driving $PRE_{23-}$ low at 549 (i.e., to V2) to (i) switch on transistor 371 and thus couple inverter pair 355/356 to V3 and (ii) enable column logic 475 to drive bit lines $BL_{01+}/BL_{01-}$ to a differential state according to the state of $DATA_{W+}$. More specifically, if $DATA_{W+}$ is high (and thus $DATA_{W-}$ is low), the outputs of AND gates 487 and 488 will go high (while the outputs of AND gates 489 and 490 go low) to switch on transistors 485 and 494 and thereby drive bitline $BL_{01+}$ to V1 and $BL_{01-}$ to V0. Conversely, if $DATA_{W+}$ is low, the outputs of gates 489 and 490 will go high (while the outputs of gates 487 and 488 go low), to switch on transistors 486 and 493 and thus drive $BL_{01-}$ to V1 and $BL_{01+}$ to V0. This differential write data delivery via column bitlines BL01+/BL01− is shown in FIG. 10 at 551.

Still referring to FIGS. 9 and 10, whichever of bitlines $BL_{01-}$ and $BL_{01+}$ goes low (i.e., as $PRE_{W+}$ is lowered) switches off the corresponding one of write-port transistors 373 and 374 and thereby triggers a data latching operation within back-to-back inverters 355/356. More specifically, if $BL_{01+}$ goes low, transistor 373 is switched off so that, because of the on-state of transistors 361 and 362 and their coupling to the V3 rail via transistor 371, node $BIT_{03+}$ (the output of inverter 355) begins to rise toward V3. The rising $BIT_{03+}$ node switches off transistor 362 and switches on transistor 364 within inverter 356, causing $BIT_{03-}$ to fall to V0, while the opposite is effected within inverter 355— transistor 361 is further driven on by the falling $BIT_{03-}$ node while transistor 363 is further driven off, reinforcing the transition of $BIT_{03+}$ to V3. At the conclusion of this latching operation, differential cross-domain data bit storage manifests in the latched $BIT_{03+}$ and $BIT_{03-}$ storage nodes, with one node being driven to V3 and the other to V0 in accordance with the write data value DATAW±. This storage node divergence is shown at 555 in FIG. 10. A short while after bit storage is completed (e.g., long enough to meet bit storage timing in worst-case temperature/voltage/process corner), write-enable signal $WR_{W+}$ is lowered at 559, to switch WR01+ to V0 (561) and thus turn off write-enable transistor 375.

FIG. 11 illustrates an embodiment of dual-domain content-addressable memory (CAM) cell 600 that may be deployed within the memory array of FIG. 1 to implement individual memory cells 107. CAM cell 600 includes the static data storage and write-port circuitry shown in FIGS. 7 and 9 together with a compare port 601 that enables comparison between the differentially stored data bit (cross-domain bit storage in nodes $BIT_{03+}$ and $BIT_{03-}$) and a differential comparand bit, $DATA_{M\pm}$. A memory read port (implemented by transistors 381, 382, 385, 386, 387 and 388 in FIGS. 7 and 9) may optionally be provided as indicated FIG. 11 at 603 (connections of bit-storage nodes $BIT_{03+}$ and $BIT_{03-}$ to optional read port 603 not specifically shown in FIG. 11).

Compare port 601 is formed by two pairs of match transistors 605/606 and 607/608 each coupled between V0 and cross-domain match signal node $MCH_{03+}$, with gates of the first match-transistor pair (605/606) coupled to $BIT_{03-}$ and $BL_{01+}$ (complement stored data bit and true comparand bit), respectively, and gates of the second match-transistor pair (607/608) coupled to $BIT_{03+}$ (true stored bit) and $BL_{01-}$ (complement comparand bit). Through this arrangement, a mismatch between stored and comparand bits (i.e., $BIT_{03+}$ and $BL_{01-}$ both high or $BIT_{03-}$ and $BL_{01+}$ both high) will switch on one match-transistor pair or the other to discharge $MCH_{03+}$ to V0. Match-node precharge transistor 611 is provided to precharge $MCH_{03+}$ to match-detect state V3 (i.e., a state maintained to signal a match condition in absence of mismatch-triggered discharge through a match-transistor pair) at the start of a compare cycle, and output drive transistor 615 is provided to generate an upper-domain small-swing match output, $MCH_{23-}$, pulling $MCH_{23-}$ up to V3 in response to a comparand/stored-bit mismatch (i.e., when $MCH_{03+}$ is low) and leaving $MCH_{23-}$ at precharged level V2 when the comparand bit and stored bit match (i.e., $MCH_{03+}$ high).

Referring now to FIGS. 11 and 12, a compare (match) operation commences with assertion of precharge-enable signal $PRE_{M+}$ at the input of inverting upper-domain row-line driver 641 (as shown at 671 in FIG. 12) within row logic 631, driving row line $PRE_{M23-}$ to an active low state (673) and thereby switching on match-node precharge transistor 611 to precharge cross-domain match node ($MCH_{03+}$) to V3 as shown at 675 (or maintaining MCH03+ at V3 if already at that voltage by virtue of a prior compare operation). Precharge-enable signal $PRE_{M+}$ is also applied to line drivers 651 and 652 within column logic 633 (i.e., via OR gates 653 and 654, respectively) to drive V3 at the gates of transistors 655 and 656 and thereby discharge (precharge) bitlines $BL_{01+}$ and $BL_{01-}$ to V0 as shown at 677. Note that synchronous or asynchronous delay may be instituted within row logic 631 to avoid contention at node $MCH_{03+}$ bp ensuring that $PREM_{23-}$ does not go low (V2) until after bitlines $BL_{01-}$ and $BL_{01+}$ are discharged (i.e., switching off transistors 606 and 608 to isolate $MCH_{03+}$ from V0 before switching on transistor 611 to couple $MCH_{03+}$ to V3). In any case, shortly after $MCH_{03+}$ goes high, a match-line precharge signal ($MCH_{M+}$, itself a delayed version of $PRE_{M+}$) is raised to produce a low (V0) signal at the gate of PMOS transistor 645 (i.e., via inverting line driver 643) and thus precharge match line $MCH_{23-}$ to the lower supply rail (V2) of the upper voltage domain (shown at 679 in FIG. 12). $END_{M+}$ is raised within column logic 633 (e.g., at roughly the same time that $MCH_{M+}$ goes high and as $PRE_{M+}$ goes low) to enable the match data state (comparand bit) to differentially drive bitlines $BL_{01+}$ and $BL_{01-}$ with small-swing lower domain signals. More specifically, if the comparand bit is a logic '1' ($DATA_{M+}$=HI, $DATA_{M-}$=LO), logic gates 661 and 662 will produce high outputs at respective inputs of cross-domain signal drivers 667 and 652 thereby driving V3 to the gate terminals of transistors 669 and 656, switching those transistors on to drive $BL_{01+}$ to V1 and $BL_{01-}$ to V0. In that same comparand bit state, the outputs of AND gates 663 and 664 go low to produce V0 outputs from drivers 651 and 668, thereby switching off transistors 655 and 670. In the inverse comparand bit state, inverse output states are generated within AND gates 661, 662 (producing logic-low signals) and AND gates 663, 664 (producing logic-high signals) to yield, via respective line drivers 651 and 668, V3 at gates of transistors 655 and 670 (and V0 at gates of transistors 669 and 656) to drive $BL_{01+}$ to V0 and $BL_{01-}$ to V1.

Divergence of bitlines BL01− and BL01+ to differential states (i.e., one or the other of the bitlines rising to V1 according to comparand data bit state while the other remains at V0—as shown at 681 in FIG. 12) effects a compare operation within the match-transistor pairs 605/606 and 607/608, discharging cross-domain match node $MCH_{03+}$ to V0 through one transistor pair or the other if the comparand bit and stored data bit do not match and, conversely, maintaining match node in its isolated state (and thus at precharged level V3) if the comparand bit and stored data bit do match. More specifically, in the match case, one transistor in each pair 605/606 and 607/608 will be switched off while the other is switched on (no connection between $MCH_{03+}$ and V0), while in the mismatch case, both transistors within one pair will be switched on (connecting $MCH_{03+}$ to V0) while both transistors in the other pair are switched off. If $MCH_{03+}$ is discharged to V0 (mismatch), output-drive transistor 615 is switched on (super-driven gate) to raise $MCH_{23-}$ to V3. Conversely, if $MCH_{03+}$ remains at V3 (match), transistor 615 remains off so that $MCH_{23-}$ remains at precharged/initialized state V2. This operation is reflected by the "match/mask" and "mismatch" states of $MCH_{23-}$ shown at 683 in FIG. 12.

Still referring to FIGS. 11 and 12, the worst-case (longest) settling time for match signal $MCH_{23-}$ occurs in the data/comparand mismatch ($BIT_{03}<>DATA_M$) as $MCH_{03+}$ transitions from V3 to V0 (shown at 685 in FIG. 12) to switch on transistor 615 and thereby drive $MCH_{23-}$ from V2 to V3. In that circumstance, the cross-domain amplitude of $MCH_{03+}$, dropping from V3 to V0, super-drives the gate of PMOS transistor 615 to rapidly charge relatively high-capacitive match line $MCH_{23-}$ to V3, speeding output of the match result. Also, masking (i.e., preventing indication of mismatch) within a given comparand bit position within a column of the CAM array may be effected by driving otherwise differential data signal $DATA_{M+}/DATA_{M-}$ with same-state logic-low signals, thus switching on cross-domain signal drivers 651 and 652 within column logic 633 to super-drive (drive V3 at) the gates of transistors 655 and 656, while transistors 669 and 670 remain off. By this operation, bitlines $BL_{01-}$ and $BL_{01+}$ are both driven to V0 (discharged) for the subject column of CAM cells 600 so that transistors 606 and 608 are both switched off (preventing discharge of $MCH_{03+}$) to suppress (disable or mask) mismatch signal generation within each CAM cell of that column.

FIGS. 13 and 14 illustrate CAM write circuitry within column logic 701 and row logic 703 and operational timing for a memory write access within CAM cell 600 (the same CAM cell shown in FIG. 11). In general, the write operation and signal transitions shown in FIG. 14 match those discussed in reference to FIGS. 9 and 10 as the bit storage and write access circuitry within CAM cell 600 are implemented generally as shown in static memory cell 350 and column/row logic (701/703) are likewise implemented generally as shown with respect to static-cell column and row logic circuits 475 and 477. Though not specifically shown, row logic signal $PRE_{M+}$ (discussed above in reference to FIGS. 11 and 12) is held low throughout the write operation, driving row-line $PREM_{23-}$ to V3 (i.e., via line driver 641 shown in FIG. 11) so that precharge transistor 611 remains switched off—avoiding contention on match node $MCH_{03+}$ as bitlines $BL_{01-}$ and $BL_{01+}$ are precharged to V1 and then differentially driven according to the write data state ($DATA_{W\pm}$).

FIG. 15 illustrate an exemplary implementation of read-port 603 within CAM cell 600 (i.e., CAM cell shown FIGS. 11 and 13) and corresponding data-read circuitry within row and column logic circuits 721 and 723, while FIG. 16 illustrates operational timing for a memory read access within CAM cell 600. In general, the read operation and signal transitions shown in FIG. 16 match those discussed in reference to FIGS. 7 and 8 as the bit storage, read port 603, row logic 721 and column logic 723 may be implemented as shown in FIG. 7. As in the case of a CAM write access, row logic signal $PRE_{M+}$ is held low throughout the read operation, driving row-line $PREM_{23-}$ to V3 (i.e., via line driver 641 shown in FIG. 11) so that the precharge transistor within compare circuitry 601 remains switched off, thereby avoiding contention as bitlines $BL_{01-}$ and $BL_{01+}$ are precharged to V1 and then differentially driven according to the stored data state ($BIT_{03}+$).

FIGS. 17-19 illustrate exemplary embodiments of intra-domain (small-swing) and cross-domain (large-swing) line drivers, all having circuitry to super-drive one or the other of two output-stage transistors according to the state of a small-swing input signal, $IN_{01+}$. In the depicted embodiments, input signal $IN_{01+}$ is assumed to be an active-high single-ended signal constrained to the lower (V1/V0) voltage domain, and an inverter stage formed by transistors 751 and 753 is provided to produce complement input signal $IN_{01-}$. In alternative embodiments, the input signal may be supplied in the upper voltage domain, may be active-low, and/or may be differential (i.e., two input signal lines conveying complementary signal states, $IN_+$ and $IN_-$ in which case inverter stage 751/753 may be omitted.

Referring specifically to the level-shifting small-swing line driver of FIG. 17, input signal $IN_{01+}$ and its complement (IN01−) are supplied to gates of drive-node pull-down transistors 755 and 757 so that, depending on the input signal state, one of transistors 755 and 757 will be switched on to couple the corresponding output-drive node 761 or 763 to V0, while the other of transistors 755 and 757 is switched off. Drive-node pull-up transistors 765 and 767 are coupled source-to-drain between upper-domain rail V3 and output-drive nodes 761 and 763, respectively, and have gate terminals cross-coupled to counterpart drain terminals. That is, the gate of transistor 765 is coupled to drain terminal of transistor 767 (and vice-versa) and thus to the counterpart output-drive node (gate of transistor 765 coupled to output drive node 763; gate of transistor 767 coupled to output drive node 761) so that whichever of output-drive nodes 761 and 763 is pulled down to V0 via transistors 755 and 757 will switch on the pull-up transistor 765 or 767) coupled to the other of the output-drive nodes, thereby pulling that node to V3. Conversely, whichever of output drive nodes 761 and 763 is pulled up to V3 (i.e., via respective pull-up transistor 765 or 767) will switch off the other of pull-up transistors 765 or 767 to avoid contention on the pulled-down output-drive node. Altogether, output-drive nodes 761 and 763, which are coupled to respective gates of output-stage transistors 771 and 773, are driven to cross-domain (V0 and V3) differential voltage levels so that whichever of output stage transistors 771 and 773 is coupled to the V3 output-drive node will be switched off, while the other output stage transistor will be switched on (and super-driven) by the V0 potential of the counterpart output-drive node. Accordingly, one of the two output stage transistors 771 and 773 will produce a high-current output signal ($OUT_{23+}$ in this example) at a respective rail of the upper voltage domain (V2 or V3). More specifically, in this active-high output example, a logic-high lower-domain input signal ($IN_{01+}$ =V1) will yield a high-current logic-high upper-domain output signal ($OUT_{23+}$=V3) and a logic-low input signal ($IN_{01+}$=V0) will yield a high-current logic-low output signal ($OUT_{23+}$=V2). An inverting version of the same level-shifting small-swing line driver may be implemented either by swapping the complementary input-signal connections to pull-down transistors 755 and 757, or swapping the connections of output drive nodes to output-stage transistors 771 and 773.

FIG. 18 illustrates a non-shifting small-swing line driver that yields a high-current small-swing output signal in the same voltage domain as the input signal—i.e., no level-shift between voltage domains. As in the embodiment of FIG. 17, an active-high input signal $IN_{01+}$ is supplied to inverter stage 751/753 to deliver complementary input signals ($IN_{01+}$ and $IN_{01-}$) to the gates of pull-down transistors 755 and 757, and cross-coupled pull-up transistors 765 and 767 are provided to pull up whichever of output-drive nodes 761 and 763 is not pulled down by its respective pull-down transistor. Instead of PMOS output-stage transistors coupled between upper-domain voltage rails, however, the non-shifting driver output stage is implemented by NMOS transistors 781 and 783 coupled between lower-domain voltage rails, V0 and V1. By this arrangement, whichever of the output-drive nodes is pulled-up to V3 will super-drive the gate of the corresponding output-stage transistor (781 or 783), thus effecting a high-current output (source or sink) on the output line ($OUT_{01-}$ in this example). The counterpart output-stage transistor (781 or 783) will be switched off by the pulled-down state of its output node. Signal inversion occurs in the depicted embodiment, with a logic low input ($IN_{01+}$=V0) producing a high-current active-low output ($OUT_{01-}$=V1) and vice-versa. A non-inverting non-shifting driver may be implemented by swapping the complementary input signal connections to transistors 755 and 757 or swapping the output-drive node connections to output-stage transistors 781 and 783. Also, a non-shifting upper-domain line driver (i.e., receiving an upper-domain input signal and producing a high-current upper-domain output signal) may be implemented by inverting all transistor and voltage-rail polarities—that is, all PMOS transistors implemented as NMOS transistors and vice-versa, and changing the V3, V1 and V0 rails to V0, V2 and V3 rails, respectively.

FIG. 19 illustrates a level-shifting large-swing line driver that produces a high-current cross-domain (V0/V3) output signal in response to a small-swing lower-domain input signal ($IN_{01+}$). As in the embodiments of FIGS. 17 and 18, input signal $IN_{01+}$ and its complement (generated by inverter 751/753) are provided to gates of pull-down transistors 755 and 757 to selectively (according to input data state) pull down (to V0) one of output-drive nodes 761 and 763, while cross-coupled pull-up transistors 765 and 767 selectively pull up (to V3) the other of the output-drive nodes. In the embodiment shown, the inverting output-drive node 761—the node that is pulled down in response to a logic high input signal) is coupled to a cross-domain output-stage inverter formed by PMOS and NMOS transistors (791 and 793) coupled in series between the V3 and V0 rails. By this arrangement, when node 761 is pulled down to V0 in response to a logic high input signal, the gate of PMOS output-stage transistor 791 is super-driven to produce a high-current V3 output signal (while NMOS transistor 793 is switched off) and, conversely, when node 761 is pulled up to V3 in response to a logic low input signal, the gate of NMOS output stage transistor is super-driven to produce a high-current V0 output signal (while PMOS transistor 791 is switched off). An inverting cross-domain driver (as opposed to the non-inverting embodiment shown in FIG. 19 in which $IN_{01+}$ yields $OUT_{03+}$) may be implemented by swapping the complementary input signal connections to pull-down transistors 755 and 757 or by coupling the output-stage inverter to the alternate output-drive node (i.e., node 763). Also, a cross-domain signal driver responsive to an upper-domain input signal may be implemented by inverting all transistor and voltage-rail polarities—that is, all PMOS transistors implemented as NMOS transistors and vice-versa, and changing the V3, V1 and V0 rails to V0, V2 and V3 rails, respectively. Also, while single-ended output drive is depicted with respect to the FIG. 19 embodiment and also those in FIGS. 17 and 18, differential output drive may be implemented in each case through provision of an additional pair of output-stage transistors with swapped (or alternate) output-drive-node coupling.

As briefly discussed above, row and column logic circuits for the various memory cell embodiments disclosed herein (e.g., dynamic memory cell, static memory cell, CAM cell) have been discretely with respect to corresponding memory access operations. In actual implementation, all such circuitry or variants thereof may or will be present which, in some cases, may result in avoidable redundancy. For example, column logic circuits 633, 701 and 723 shown with respect to CAM cell 600 in FIGS. 11, 13 and 15 includes, in each case a set of bitline-drive transistors having gates coupled to respective cross-domain drivers—an arrangement shown collectively in FIG. 20 with the connection of each drive-transistor pair to a corresponding one of bitlines $BL_{01+}$ and $BL_{01-}$. As read, write and compare operations are carried out at respective times over bitlines $BL_{01+}/BL_{01-}$ (additional bitlines may be provided to enable operational concurrency), the bitline-drive transistors and corresponding cross-domain drivers may be reduced to a single drive-transistor/cross-domain line driver pair per bitline as shown at 800, with line-driver enable logic combined as shown to yield equivalent circuit operation (e.g., three-input OR gates 801 and 803 provided with respect to drivers 805 and 807, respectively). Other column and/or row logic circuits separately shown with respect to operations in a given memory cell may likewise be combined to reduce component count and signal line loading.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, temperatures, temperature ranges, supply voltages, threshold voltages, transistor types and the like can be different from those described above in alternative embodiments. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation with an integrated-circuit memory component, the method comprising:
    receiving, within a memory array of the memory component, a first control signal that transitions between supply voltage levels of a first voltage domain;
    receiving, within the memory array, a second control signal that transitions between supply voltage levels of a second voltage domain different from the first voltage domain; and
    transitioning an output-enable signal, within a memory cell of the memory array in response to the transitions of the first and second control signals, between one of the supply voltage levels of the first voltage domain and one of the supply voltage levels of the second voltage domain to enable output signal generation on an output signal line coupled to the memory cell.

2. The method of claim 1 wherein transitioning the output-enable signal from the one of the supply voltage levels of the first voltage domain to the one of the supply voltage levels of the second voltage domain comprises transitioning the output-enable signal through a voltage range that exceeds a voltage range between the supply voltages of the first voltage domain and exceeds a voltage range between the supply voltages of the second voltage domain.

3. The method of claim 2 wherein transitioning the output-enable signal through the voltage range that exceeds the voltage range between the supply voltages of the first voltage domain and exceeds the voltage range between the supply voltages of the second voltage domain comprises transitioning the output-enable signal through a voltage range more than twice the voltage range of the first voltage domain and more than twice the voltage range of the second voltage domain.

4. The method of claim 1 wherein transitioning the output-enable signal from the one of the supply voltage levels of the first voltage domain to the one of the supply voltage levels of the second voltage domain comprises transitioning the output-enable signal between a lower one of the supply voltages of the first voltage domain and an upper one of the supply voltages of the second voltage domain, the upper one of the supply voltages of the second voltage domain exceeding an upper one of the supply voltages of the first voltage domain.

5. The method of claim 4 wherein a lower one of the supply voltages of the second voltage domain exceeds the upper one of the supply voltages of the first voltage domain.

6. The method of claim 1 wherein transitioning the output-enable signal between one of the supply voltage levels of the first voltage domain and one of the supply voltage levels of the second voltage domain to enable output signal generation on the output signal line coupled to the memory cell comprises transitioning the output-enable signal between respective supply voltage levels of the first and second voltage domains to produce, as the output signal, either a first voltage level or a second voltage level on the output signal line, the first and second voltage levels being within either the first voltage domain or the second voltage domain.

7. The method of claim 1 further comprising generating a bit-storage voltage at either a first voltage level or a second voltage level at a data storage node of the memory cell, the first voltage level being within the first voltage domain and outside the second voltage domain and, conversely, the second voltage level being within the second voltage domain and outside the first voltage domain.

8. The method of claim 7 wherein generating the bit-storage voltage at either the first voltage level or the second voltage level comprises:
    receiving a third control signal that transitions between the supply voltage levels of the first voltage domain;
    receiving a fourth control signal that transitions between the supply voltage levels of the first voltage domain; and
    receiving a write-data signal constrained to one of the first and second voltage domains.

9. The method of claim 1 further comprising:
    receiving within the memory cell a comparand data signal constrained to either the first voltage domain or the second voltage domain;
    generating at a match node of the memory cell a compare-result signal having a first voltage level within the first voltage domain or a second voltage level within the second voltage domain according to whether the comparand data signal matches a data bit stored within the memory cell.

10. The method of claim 9 further comprising:
    receiving a third control signal that transitions between the supply voltage levels of either the first voltage domain or the second voltage domain; and
    outputting a match signal from the memory array at either of two match-output voltage levels based at least in part on the compare-result signal generated at the match node of the memory cell, the two match-output voltage levels being within either the first voltage domain or the second voltage domain.

11. An integrated-circuit memory component comprising:
    an output signal line;
    access control circuitry to generate a first control signal that transitions between supply voltage levels of a first voltage domain and a second control signal that transitions between supply voltage levels of a second voltage domain different from the first voltage domain; and
    a memory cell coupled to receive the first and second control signals from the access control circuitry and having output-enable circuitry, responsive to the transitions of the first and second control signals, to transition an output-enable signal between one of the supply voltage levels of the first voltage domain and one of the supply voltage levels of the second voltage domain to enable output signal generation on the output signal line.

12. The integrated-circuit memory component of claim 11 wherein the output-enable circuitry to transition the output-enable signal from the one of the supply voltage levels of the first voltage domain to the one of the supply voltage levels of the second voltage domain comprises circuitry to transition the output-enable signal through a voltage range that exceeds a voltage range between the supply voltages of the first voltage domain and exceeds a voltage range between the supply voltages of the second voltage domain.

13. The integrated-circuit memory component of claim 12 wherein the circuitry to transition the output-enable signal through the voltage range that exceeds the voltage range between the supply voltages of the first voltage domain and exceeds the voltage range between the supply voltages of the second voltage domain comprises circuitry to transition the output-enable signal through a voltage range more than twice the voltage range of the first voltage domain and more than twice the voltage range of the second voltage domain.

14. The integrated-circuit memory component of claim 11 wherein the output-enable circuitry to transition the output-enable signal from the one of the supply voltage levels of the first voltage domain to the one of the supply voltage levels of the second voltage domain comprises circuitry to transition the output-enable signal between a lower one of the supply voltages of the first voltage domain and an upper one of the supply voltages of the second voltage domain, the upper one of the supply voltages of the second voltage domain exceeding an upper one of the supply voltages of the first voltage domain.

15. The integrated-circuit memory component of claim 14 wherein a lower one of the supply voltages of the second voltage domain exceeds the upper one of the supply voltages of the first voltage domain.

16. The integrated-circuit memory component of claim 11 wherein the output-enable circuitry to transition the output-enable signal between one of the supply voltage levels of the first voltage domain and one of the supply voltage levels of the second voltage domain to enable output signal generation on the output signal line coupled to the memory cell comprises circuitry to transition the output-enable signal between respective supply voltage levels of the first and second voltage domains to produce, as the output signal, either a first voltage level or a second voltage level on the output signal line, the first and second voltage levels being within either the first voltage domain or the second voltage domain.

17. The integrated-circuit memory component of claim 11 wherein the memory cell further has a data storage node and circuitry to generate a bit-storage voltage at either a first voltage level or a second voltage level at the data storage node of the memory cell, the first voltage level being within the first voltage domain and outside the second voltage domain and, conversely, the second voltage level being within the second voltage domain and outside the first voltage domain.

18. The integrated-circuit memory component of claim 17 wherein:
the access control circuitry additionally generates, during a data write operation:
a third control signal that transitions between the supply voltage levels of the first voltage domain,
a fourth control signal that transitions between the supply voltage levels of the first voltage domain, and
a write-data signal constrained to one of the first and second voltage domains; and
the circuitry to generate the bit-storage voltage generates the bit-storage voltage at (i) a time corresponding to the transitions of the third and fourth control signals and (ii) either the first voltage level or the second voltage level according to the write-data signal.

19. The integrated-circuit memory component of claim 11 wherein:
the access control circuitry generates, during a data compare operation, a comparand data signal constrained to either the first voltage domain or the second voltage domain; and
the memory cell has circuitry to generate a compare-result signal having a first voltage level within the first voltage domain or a second voltage level within the second voltage domain according to whether the comparand data signal matches a data bit stored within the memory cell.

20. The integrated-circuit memory component of claim 19 wherein:
the access control circuitry additionally generates, during the data compare operation, a third control signal that transitions between the supply voltage levels of either the first voltage domain or the second voltage domain; and
the memory cell has circuitry to output a match signal from the memory cell at either of two match-output voltage levels based at least in part on the compare-result signal, the two match-output voltage levels being within either the first voltage domain or the second voltage domain.

21. An integrated-circuit memory component comprising:
an output signal line;
means for generating a first control signal that transitions between supply voltage levels of a first voltage domain and a second control signal that transitions between supply voltage levels of a second voltage domain different from the first voltage domain; and
a memory cell coupled to receive the first and second control signals and having means, responsive to the transitions of the first and second control signals, for transitioning an output-enable signal between one of the supply voltage levels of the first voltage domain and one of the supply voltage levels of the second voltage domain to enable output signal generation on the output signal line.

* * * * *